(12) United States Patent
Horikiri

(10) Patent No.: US 7,473,109 B2
(45) Date of Patent: Jan. 6, 2009

(54) MOUNT STRUCTURE AND ELECTRONIC APPARATUS

(75) Inventor: Kazuhito Horikiri, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/932,855

(22) Filed: Oct. 31, 2007

(65) Prior Publication Data

US 2008/0057752 A1 Mar. 6, 2008

Related U.S. Application Data

(62) Division of application No. 11/584,420, filed on Oct. 19, 2006, now Pat. No. 7,309,240.

(30) Foreign Application Priority Data

Apr. 27, 2006 (JP) ............................ 2006-123858

(51) Int. Cl.
*H01R 12/00* (2006.01)
(52) U.S. Cl. ........................................ 439/79; 439/77
(58) Field of Classification Search .................. 439/77, 439/79, 540.1, 926
See application file for complete search history.

(56) References Cited

U.S. PATENT DOCUMENTS 5,362,243 A * 11/1994 Huss et al. ................. 439/76.1

FOREIGN PATENT DOCUMENTS

| CN | 2368136 Y | 3/2000 |
| JP | 09017479 | 1/1997 |
| JP | 2001282303 | 10/2001 |

OTHER PUBLICATIONS

Related case Office Action dated Jun. 6, 2008 for application No. 2006101366913, entitled Apparatus and Electronic Apparatus. (English Translation).

* cited by examiner

*Primary Examiner*—Khiem Nguyen
(74) *Attorney, Agent, or Firm*—Blakely, Sokoloff, Taylor & Zafman LLP

(57) ABSTRACT

A mount structure having a substrate, a connector secured to the substrate, and a flexible printed wiring board electrically connected to the connector and spaced apart from the substrate. The flexible printed wiring board is positioned below the connector and separated from the connector by a distance greater than a thickness of the substrate.

13 Claims, 5 Drawing Sheets

MOUNT STRUCTURE AND ELECTRONIC APPARATUS

CROSS-REFERENCE TO RELATED APPLICATIONS

This application is based upon and claims the benefit of priority on U.S. patent application No. Ser. 11/584,420 and Japanese Patent Application No. 2006-123858, filed Apr. 27, 2006, the entire contents of which are incorporated herein by reference.

BACKGROUND

1. Field

One embodiment of the present invention relates to a mount structure designed to hold connectors, and an electronic apparatus that has the mount structure.

2. Description of the Related Art

Various mount structures are known, each of which has a substrate holding an IC-card connector. Among these is a mount structure that uses a flexible cable. This mount structure comprises a rigid substrate, an IC-card connector, a holding unit, and a flexible cable. The IC-card connectors are secured to the rigid substrate. The holding unit holds the rigid substrate and the IC-card connector. The flexible cable electrically connects the connector to the rigid substrate. The cable extends in parallel with the rigid substrate, from one end that is connected to the IC-card connector. The cable is bent in the form of letter "U" and is connected at the other end to the rigid substrate. Thus, the cable and the connector are arranged on the same side of the rigid substrate.

In this mount structure, a flexible cable is used in addition to the holding unit. The flexible cable prevents cracks from developing in the electrical junction between the connector and the rigid substrate when another connector is inserted into or pulled out of the connector. (See, for example, Jpn. Pat. Appln. KOKAI Publication No. 9-17479.)

Suppose that the cable, i.e., a component connecting the connector and the rigid substrate, is left exposed as in the conventional mount structure described above. Then, the worker who is assembling an apparatus using the mount structure may, by mistake, pull the cable and disconnect it from the connector or the substrate, or both. If this happens, the wires may be cut in the cable. Since the cable protrudes from the rigid substrate, the mount structure may occupy a relatively large space in the housing of the apparatus being assembled.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a mount structure having a substrate, a connector secured to the substrate, and a flexible printed wiring board electrically connected to the connector and spaced apart from the substrate. The flexible printed wiring board is opposed to the connector across the substrate or arranged in a space having a height equal to the thickness of the substrate.

An electronic apparatus that is a first embodiment of this invention will be described with reference to FIGS. 1 to 6.

Figure 1:
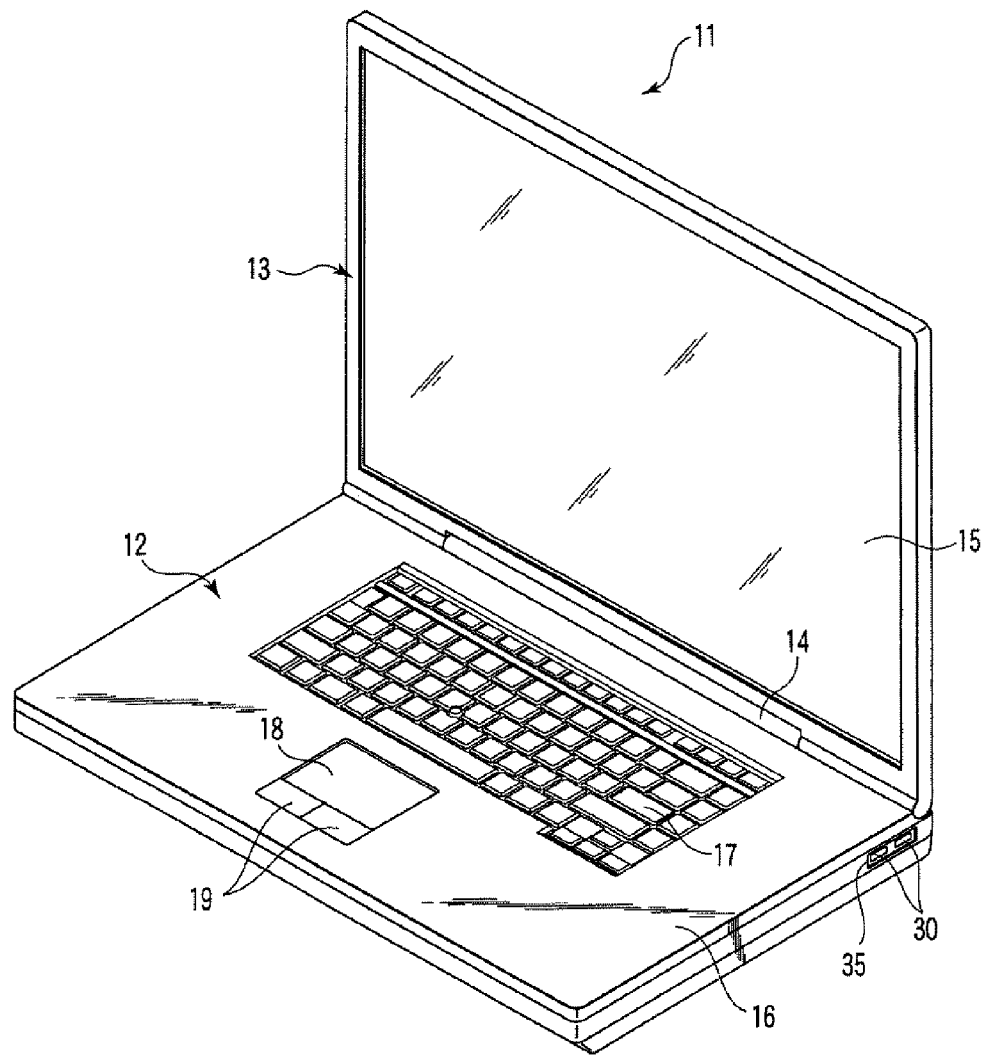
FIG. 1 is an exemplary perspective view of a portable computer according to a first embodiment of this invention.
Figure 2:
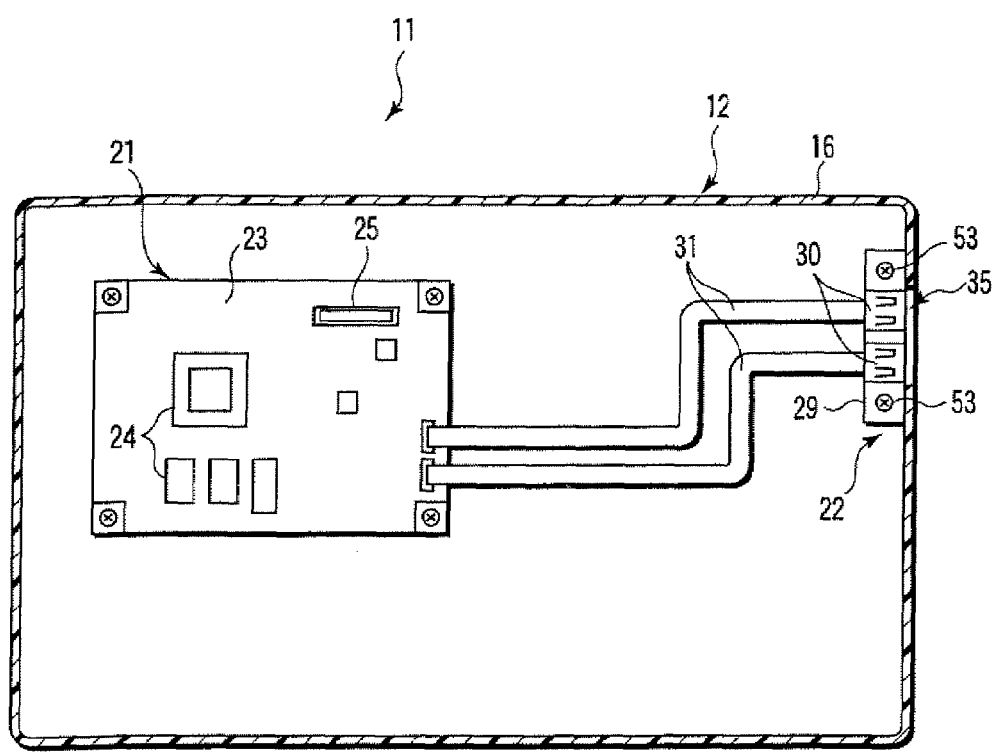
FIG. 2 is an exemplary sectional view of the housing of the portable computer (FIG. 1), taken along a horizontal plane.

As shown in FIG. 1 and FIG. 2, the portable computer 11 comprises a main unit 12, a display unit 13, and a hinge unit 14. The hinge unit 14 couples the display unit 13 to the main unit 12, allowing the display unit 13 to rotate. The display unit 13 has a display 15.

The main unit 12 has a housing 16, a keyboard 17, a touchpad 18, and buttons 19. The housing 16 is made of resin. The touchpad 18 is a pointing device.

As shown in FIG. 2, the housing 16 incorporates a printed circuit board 21 and a mount structure 22. The printed circuit board 21 has a printed wiring board 23, circuit components 24, and a connector 25. The circuit components 24 are mounted on the printed wiring board 23. The connector 25 achieves internal connection.

Figure 3:
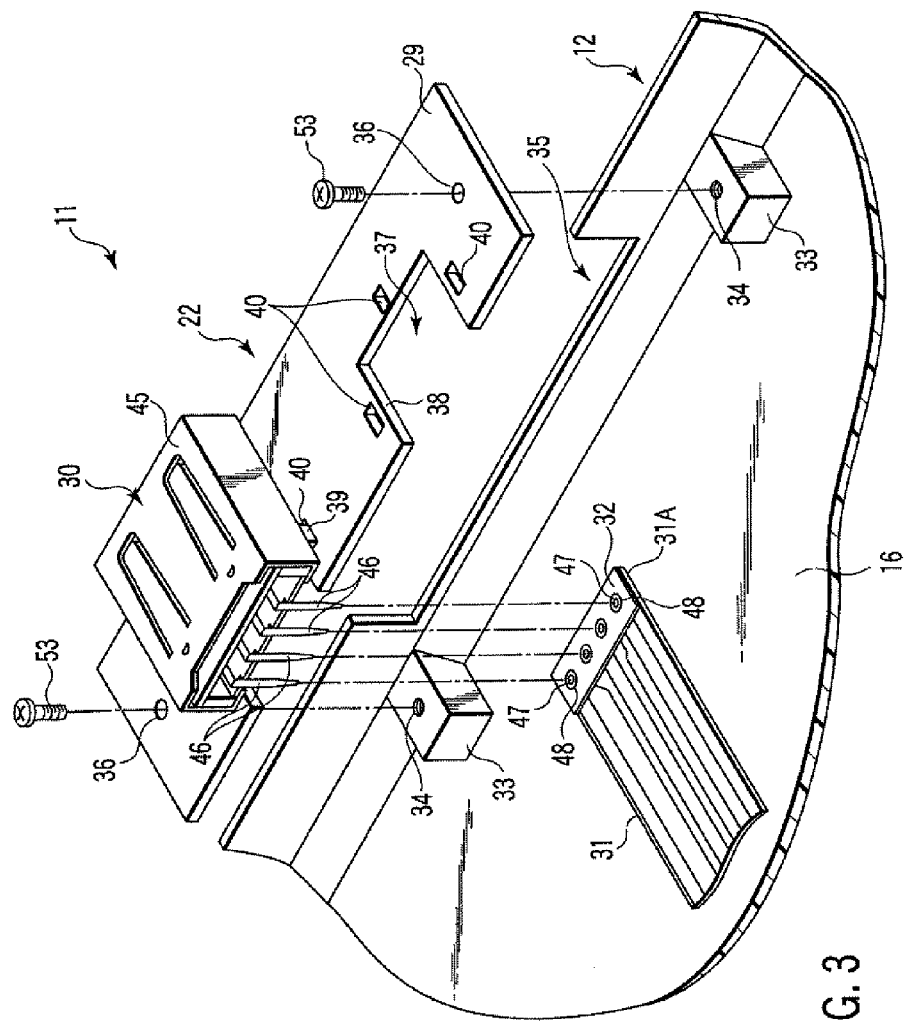
FIG. 3 is an exemplary exploded view of the mount structure incorporated in the housing shown in FIG. 2.

As FIGS. 2 and 3 show, the mount structure 22 has a first substrate 29, a pair of connectors 30, flexible printed wiring boards 31, and a second substrate 32. The connectors 30 are secured to the first substrate 29. The flexible printed wiring boards 31 are electrically connected to the connectors 30. The housing 16 has a pair of boss sections 33, screw holes 34, and an opening 35. The screw holes 34 are made in the boss sections 33, respectively. The opening 35 for exposes the connectors 30. In FIG. 3, only one connector 30 and only one flexible printed wiring board 31 are illustrated.

As further shown in FIGS. 2 and 3, according to one embodiment of the invention, the first substrate 29 is, for example, a glass epoxy substrate. The first substrate 29 has through holes 36, a pair of notches 37, edges 38, and three holding holes 40. The holes 36 are used to secure the first substrate 29 to the housing 16. The notches 37, rectangular shaped in this embodiment, receive the connectors 30, respectively. The edges 38 define the rims of the notches 37. In the three holding holes 40, rectangular shaped in this embodiment, three claws 39 of one connector 30 are inserted, respectively. The holding holes 40 are located near the notches 37, respectively.

Figure 5:
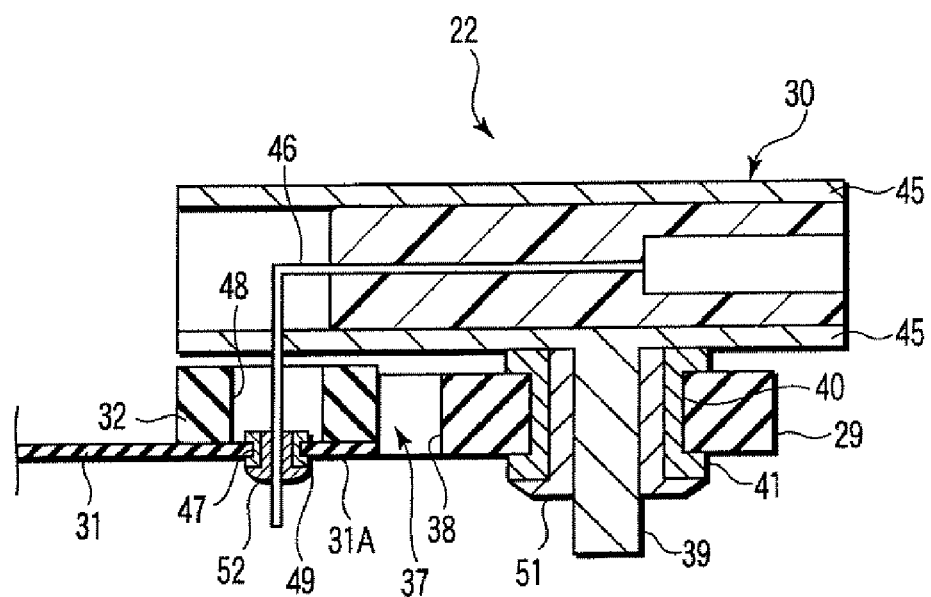
FIG. 5 is an exemplary sectional view of the mount structure shown in FIG. 3, taken along a vertical plane.

As shown in FIG. 5, a copper plated layer 41 is formed on those surface parts of the first substrate 29, which surround the holding holes 40, so that the claws 39 may be soldered in the holding holes 40. Note that a part of the housing 16 may be used as first substrate 29 that is made of glass epoxy. In this case, the housing 16 is copper-plated on both surfaces.

As shown in FIGS. 2 and 3, each connector 30 comprises, for example, a universal serial bus (USB). The connector 30 has a shell 45, claws 39, and terminals 46. The claws 39 are integrally formed with the shell 45 and extend from the shell 45. The terminals 46 are connected to the flexible printed wiring board 31. The connector 30 is not limited to a USB. It can be a connector of any other type, such as a D-SUB connector or a DIN connector. As FIG. 3 shows, the terminals 46 pass through the notches 37 of the first substrate 29.

Figure 4:
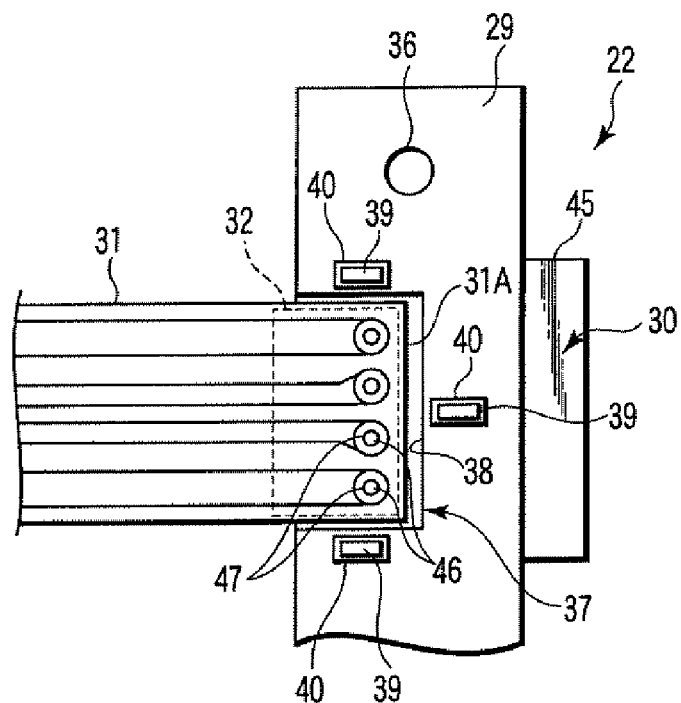
FIG. 4 is an exemplary bottom view of the mount structure shown in FIG. 3, as viewed from below.

As seen from FIG. 2, the flexible printed wiring boards 31 are shaped like bands that are bendable such as in the form of a crank as shown. As shown in FIG. 4, each flexible printed wiring board 31 has an end part 3 1A, to which the terminals 46 of one connector 30 are connected. According to one embodiment of the invention, the end part 31A is as broad as or less board than the notch 37. The end part 31A has through holes 47, though which the terminals 46 pass. As FIG. 5 shows, the rims of the through holes 47 are covered with plated copper layers 49. As shown in FIGS. 4 and 5, each flexible printed wiring board 31 is spaced from the first substrate 29, though its end part 31A is fitted in the notch 37 and connected to the terminals 46.

As seen from FIG. 4, the end part 31A of the flexible printed wiring board 31 is surrounded by the edges 38 of the first substrate 29 as long as it is connected to the connector 30. As FIG. 5 shows, the flexible printed wiring board 31 is arranged in a space whose height is equal to the thickness of the first substrate 29. As shown in FIG. 3, the end part 31A lies between the housing 16 and the connector 30 as long as the mount structure 22 remains attached to the housing 16. As FIG. 2 shows, the other-end part of the flexible printed wiring board 31 is connected to the printed circuit board 21.

As shown in FIG. 3, the second substrate 32 is adhered to that face of the end part 3 1A of the flexible printed wiring board 31, which opposes the connector 30. The second substrate 32 is a rectangular plate and has the same width as the flexible printed wiring board 31. Therefore, the width of the second substrate 32 is equal to or smaller than that of the notch 37. The second substrate 32 has through holes 48, through which the terminals 46 extend. The second substrate 32 is, for example, a glass epoxy substrate.

Figure 6:
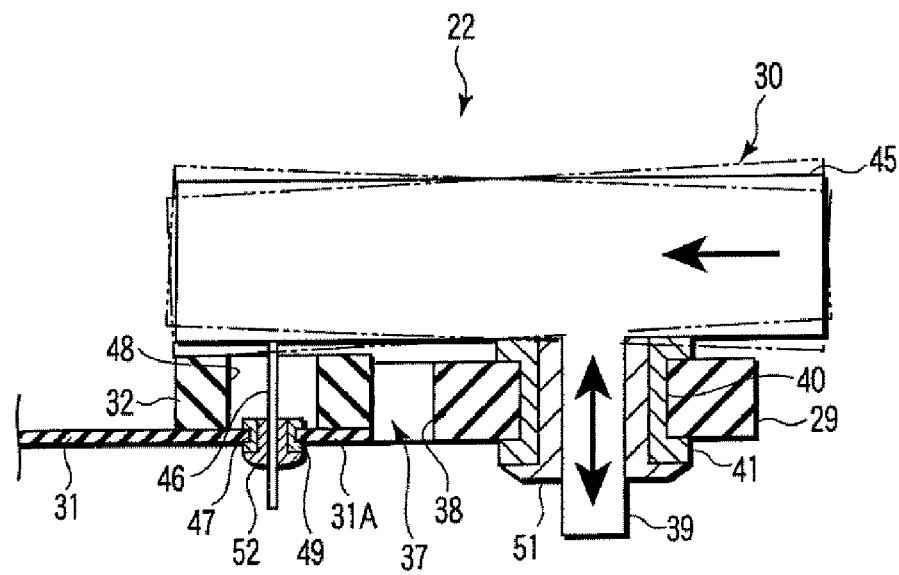
FIG. 6 is an exemplary sectional view of the mount structure shown in FIG. 3, which is applied with a stress.

When connectors having a shape complementary to the connectors 30 of the mount structure 22 are inserted into the connectors 30, respectively, the connectors 30 receive a lateral stress. This stress bends the connectors 30 and the first substrate 29 as shown in FIG. 6, causing the connectors 30 to swing. The claws 39 of the connectors 30 transmit the stress to the first substrate 29. Nonetheless, the terminals 46 and the flexible printed wiring boards 31 can move together with first substrate 29, because they are spaced from the first substrate 29. Hence, the stress applied to the terminals 46 (i.e., electrical connection components) and at the through hole 47 is very small.

How the mount structure 22 of this embodiment is assembled will be explained, with reference to FIGS. 3 to 5. As FIG. 3 shows, the connectors 30 are secured to the first substrate 29, with the terminals 46 passing through the notches 37 of the first substrate 29. The connectors 30 are fastened to the first substrate 29 as the claws 39 of the connectors 30 are fitted in the holding holes 40 of the first substrate 29. After the claws 39 have been fitted into the holding holes 40, the connectors 30 are secured to the first substrate 29 solder 51 as is illustrated in FIG. 5.

The terminals 46 of the connectors 30 are guided through the holes 47 of the flexible printed wiring board 31, and connectors 30 are connected to the flexible printed wiring board 31. The second substrates 32 are fitted in the notches 37, respectively. The through holes 48 of the second substrate 32 and the through holes 47 of the flexible printed wiring board 31 are thus easily aligned with the terminals 46 of the connector 30. The terminals 46 extending through the holes 47 are electrically connected to the flexible printed wiring board 31, with solder 52 filling up the through hole 47. Thus, the mount structure 22 according to this embodiment is assembled. The mount structure 22 is fastened, with screws 53, to the boss section 33 of the housing 16. The mount structure 22 is thereby held in the housing 16 of the portable computer 11.

In this embodiment, the first substrate 29 and flexible printed wiring board 31 are spaced apart in a vertical (thickness) direction. Therefore, a stress, if applied to those parts of the connectors 30 which are secured to the first substrate 29, no stress is applied to the electrical junction between each connector 30 and the flexible printed wiring board 31. Further, since each flexible printed wiring board 31 is arranged in a space whose height is equal to the thickness of the first substrate 29, its end part 31A does not project toward first substrate 29. Therefore, the flexible printed wiring board 31 is therefore prevented from being damaged, and the space in the housing 16 can be used efficiently.

Terminals 46 of the connectors 30 pass through the notches 37 of the first substrate 29. Therefore, the terminals 46 are not exposed outside. This reduces the possibility of damaging the terminals 46 when the housing 16 is opened to repair any components within the housing 16.

The end part 31A of each flexible printed wiring board 31 is fitted in the notch 37 and is connected to the terminals 46. That is, the end part 31A lies within the notch 37. This enhances the use efficiency of space in the housing 16. Further, the first substrate 29 protects the terminals 46 and the end part 31A, which constituting an electrical junction between the connector 30 and the flexible printed wiring board 31, because the end part 31A is fitted in the notch 37, is connected to the terminals 46 and is surrounded by the edge 38 of first substrate 29. Moreover, the mount structure 22 excel not only in mechanical strength, but also in thermal resistance, and can therefore withstand the heat applied in soldering, because the first substrate 29 is a glass epoxy substrate and its edge 38 surrounds the end part 31A.

The mount structure according to this embodiment has the second substrate 32 secured to that face of the end part 31A, which faces the connector 30. The second substrate 32 can be fitted into the notch 37. Hence, the second substrate 32 can serve to guide the flexible printed wiring board 31 to the connector 30 and to fit the board 31 into the notch 37. Since the second substrate 32 is so fitted into the notch 37 of the first substrate 29, the terminals 46 are easily aligned with the through hole 47 of the flexible printed wiring board 31.

Once the second substrate 32 is fitted in the notch 37, one through hole 47, one terminal 46, and solder 52 lie in each through hole 48 of the second substrate 32. The through holes 47, the terminals 46 and solder 52 can therefore be protected against external impacts. Further, the second substrate 32 reinforces the end part 31A of the flexible printed wiring board 31. This prevents the flexible printed wiring board 31 from being wrinkled or bent because of the heat applied to solder the terminals 46 to the flexible printed wiring board 31.

Being a glass epoxy substrate, the second substrate 32 can impart sufficient mechanical strength and high thermal resistance to the second substrate 32. This also reliably prevents the flexible printed wiring board 31 from being wrinkled or deformed in any other way when it is heated while the terminals 46 are being soldered to the board 31.

The end part 31A of each board 31 is arranged between the housing 16 and one connector 30. The electrical junction between the connector 30 and the board 31 is not exposed outside. Thus, the electrical junction is protected from anything outside the housing 16.

Figure 7:
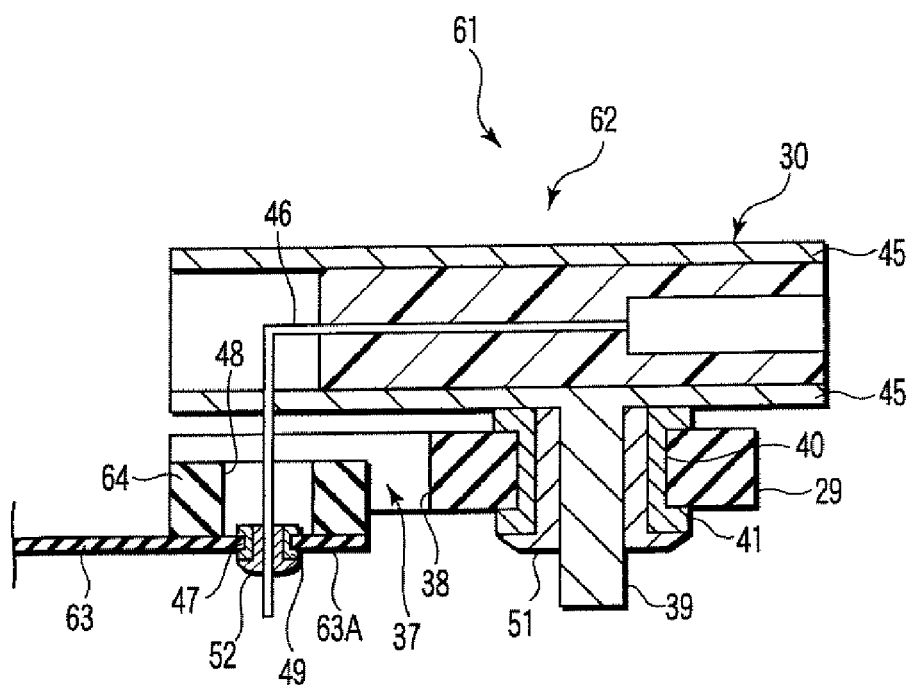
FIG. 7 is an exemplary sectional view of the mount structure incorporated in a portable computer concerning a second embodiment of the present invention.

A portable computer 61 that is a second embodiment of this invention will be described, with reference to FIG. 7. This portable computer 61 is identical to the portable computer 11 (i.e., the first embodiment), except that the flexible printed wiring board 63 and the second substrate 64 take specific positions in the mount structure 62. Therefore, the components identical to the counterparts of the computer 11 are designated at the same reference numbers and will not be described.

The mount structure 62 used in the portable computer 61 has a substrate 29, a pair of connectors 30, flexible printed wiring boards 63, and a second substrate 64. The connectors 30 are secured to the substrate 29. The flexible printed wiring boards 63 are electrically connected to the connectors 30. The second substrate 64 is secured to the flexible printed wiring board 63.

In mount structure 62, the flexible printed wiring board 63 and the second substrate 64 lie at lower levels than their counterparts of the mount structure 22 (i.e., the first embodiment). More precisely, the flexible printed wiring board 63 is opposed to the connectors 30 across the substrate 29.

The end part 63A of each flexible printed wiring board 63 is as broad as or less broad than each notch 37. The end part 63A is connected to the terminals 46 and surrounded by the edge 38 of the substrate 29. It is arranged between the case 16 and one connector 30.

In the mount structure 62 according to the second embodiment, the end part 63A of each flexible printed wiring board 63 is opposed to one connector 30 across the substrate 29. Therefore, the end part 63A and the terminals 46 are spaced from the connector 30, with the substrate 29 located between them and the connector 30. Note that that connector 30 is exposed outside the housing 16 and likely to receive impacts. Thus, the substrate 29 protects the end part 63A and the terminals 46 from impacts, if any, which the connector 30 has received.

Electronic apparatuses according to this invention are not limited such portable computers as described above. The invention can be applied to the electronic apparatuses of other types, such as portable data terminals. Various changes and modifications can, of course, be made on the electronic apparatuses according to this invention, without departing from the scope and spirit of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An apparatus comprising:
   a substrate;
   a connector coupled to the substrate; and
   a flexible printed wiring board electrically connected to the connector and spaced apart from the substrate, the flexible printed wiring board being positioned below the connector and separated from the connector by a distance greater than a thickness of the substrate, wherein the flexible printed wiring board includes an end part to be fitted in a notch of the substrate and to be coupled lo the connector.

2. The apparatus according to claim 1, wherein the substrate is a glass epoxy substrate.

3. The apparatus according to claim 1, further comprising a second substrate adhered to a side of the end part of the flexible printed wiring board that faces the connector and configured to fit in the notch.

4. The apparatus according to claim 1, wherein the substrate includes edges which define a rim of the notch, and the end part of the flexible printed wiring board is surrounded by the edges of the substrate.

5. The apparatus according to claim 4, wherein the substrate is a glass epoxy substrate.

6. The apparatus according to claim 1, further comprising a second substrate which is adhered to a side of the end part of the flexible printed wiring board facing the connector and is configured to fit in the notch.

7. The apparatus according to claim 6, wherein the second substrate is a glass epoxy substrate.

8. The apparatus according to claim 6, wherein the end pan of the flexible printed wiring board is secured to the second substrate.

9. The apparatus according to claim 8, wherein a top surface of the end part of the flexible printed wiring board is secured to a bottom surface of the second substrate.

10. An electronic apparatus comprising:
    a first substrate;
    a connector secured to the first substrate; and
    a flexible printed wiring board electrically connected to the connector, spaced apart from the first substrate and positioned below the connector and the first substrate, wherein the flexible printed wiring board includes an end part to be fitted in a notch of the first substrate and to be coupled to the connector.

11. The electronic apparatus according to claim 10, wherein the flexible printed wiring board is positioned below the connector and separated from the connector by a distance at least equal to a thickness of the first substrate.

12. The electronic apparatus according to claim 10 further comprising:
    a second substrate partially positioned within the notch and physically separate from the first substrate, the second substrate including at least one through hole to receive a terminal of the connector and allow the terminal to be coupled to the first end of the flexible printed wiring board.

13. An electronic apparatus comprising:
    a first substrate;
    a second substrate partially placed within a notch formed by the first substrate, the second substrate positioned lower than the first substrate; and
    a connector secured to the first substrate and extending one or more terminals of the connector through the second substrate; and
    a flexible printed wiring board electrically being (i) connected to the connector, (ii) spaced apart from the first substrate, (iii) positioned below the connector, the first substrate and the second substrate, and (iv) attached to a bottom surface of the second substrate.

* * * * *